United States Patent
Kaburagi et al.

(10) Patent No.: US 6,890,664 B2
(45) Date of Patent: May 10, 2005

(54) ENTRY BOARDS FOR USE IN DRILLING SMALL HOLES

(75) Inventors: Shingo Kaburagi, Tokyo (JP); Yoshikazu Uda, Tokyo (JP); Susumu Takada, Shiga (JP); Hideo Kawai, Shiga (JP)

(73) Assignees: Ohtomo Chemical Inc., Corp., Tokyo (JP); Showa Denko Packaging Co., Isehara (JP)

( * ) Notice: Subject to any disclaimer, the term of this patent is extended or adjusted under 35 U.S.C. 154(b) by 166 days.

(21) Appl. No.: 10/380,322
(22) PCT Filed: Sep. 10, 2001
(86) PCT No.: PCT/JP01/07850
§ 371 (c)(1), (2), (4) Date: Mar. 13, 2003
(87) PCT Pub. No.: WO02/22329
PCT Pub. Date: Mar. 21, 2002

(65) Prior Publication Data
US 2004/0023059 A1 Feb. 5, 2004

Related U.S. Application Data
(60) Provisional application No. 60/303,147, filed on Jul. 6, 2001.

(30) Foreign Application Priority Data
Sep. 14, 2000 (JP) ........................ 2000-279464

(51) Int. Cl.$^7$ .............................................. B32B 15/08
(52) U.S. Cl. ....................... 428/461; 428/332; 428/458; 408/1 R
(58) Field of Search ............................... 428/461, 332, 428/458; 408/1 R

(56) References Cited

U.S. PATENT DOCUMENTS

| | | | | |
|---|---|---|---|---|
| 4,781,495 A | * | 11/1988 | Hatch et al. | 408/1 R |
| 5,082,402 A | * | 1/1992 | Gaku et al. | 408/1 R |
| 5,480,269 A | * | 1/1996 | Ejiri et al. | 408/1 R |
| 5,507,603 A | * | 4/1996 | Nakano et al. | 408/1 R |
| 5,785,465 A | * | 7/1998 | Korbonski | 408/1 R |
| 5,961,255 A | * | 10/1999 | Korbonski | 408/1 R |
| 6,753,300 B2 | * | 6/2004 | Eziri et al. | 508/100 |
| 2002/0051684 A1 | * | 5/2002 | Eziri et al. | 408/1 R |
| 2002/0085888 A1 | * | 7/2002 | Velpari | 408/1 R |
| 2003/0100456 A1 | * | 5/2003 | Hasaki et al. | 508/517 |
| 2003/0129030 A1 | * | 7/2003 | Johnston | 408/1 R |
| 2004/0023059 A1 | * | 2/2004 | Kaburagi | 428/650 |

FOREIGN PATENT DOCUMENTS

| JP | 10-6298 | 1/1996 |
|---|---|---|
| JP | 8-155896 | 6/1996 |

* cited by examiner

Primary Examiner—D. Lawrence Tarazano
(74) Attorney, Agent, or Firm—Oblon, Spivak, McClelland, Maier & Neustadt, P.C.

(57) ABSTRACT

An entry board for use in drilling small holes in boards: the entry board comprises a lubricant layer of a mixture of a polyethylene glycol having an average molecular weight of at least 3000 to less than 10000, a polyethylene glycol having an average molecular weight of at least 10000 and trimethylolpropane formed over at least one surface of an aluminum base board with an undercoat layer of a partially saponified product of polyvinyl acetate provided between the lubricant layer and the base board. The partially saponified polyvinyl acetate has a degree of saponified 15 to 70 mole % and has an average molecular weight of 9000 to 50000. The adhesion of the lubricant layer to the base board is excellent, and the lubricant layer prevents cracking.

24 Claims, 1 Drawing Sheet

ENTRY BOARDS FOR USE IN DRILLING SMALL HOLES

CROSS REFERENCE TO RELATED APPLICATION

This application is an application filed under 35 U.S.C. §111(a) claiming the benefit pursuant to 35 U.S.C. §119(e)(1) of the filing data of Provisional Application No. 60/303,147 filed Jul. 6, 2001 pursuant to 35 U.S.C. §111(b).

TECHNICAL FIELD

The present invention relates entry boards for use in drilling small holes, such as through holes, in blank boards for wiring boards, for example, for producing printed wiring boards.

BACKGROUND ART

In producing printed wiring boards, small holes are formed in blank boards for the printed wiring boards by placing the blank boards in the form of superposed layers on a backup board, disposing an entry board on the upper surface of the uppermost blank board, and forming a through hole in the entry board from above and also a small hole in all the blank boards at a time using a drill in this state as is known.

Conventionally used as the entry board is an aluminum board, e.g., an aluminum board of AA1100-H18 material, chiefly for the purpose of preventing defacement and reducing formation of burrs when holes are drilled in the blank board for the printed wiring board. With electronic components mounted on printed wiring boards with a higher density in recent years, it is required to form small holes of up to 0.3 mm in diameter. This gives rise to the problem that use of aluminum boards as entry boards permits drill bits to skid on the board surface, frequently breaking drill bits. Because of the frequent breaks in drill bits, it is impossible to superpose an increased number of blank boards for drilling to provide printed wiring boards, hence the problem of a poor efficiency. Further since the drill bits skid on the board surface, there is the problem that small holes are not formed in position accurately. Another problem is encountered in that the inner peripheral wall defining the small hole formed becomes rough-surfaced.

Accordingly, it appears feasible to use as an entry board for use in drilling small holes an aluminum base board having a lubricant layer formed on at least one surface thereof by affixing a lubricant sheet thereto in order to overcome these problems and to prevent breaks in drill bits, eliminate roughness from the inner peripheral surfaces defining small holes and ensure improved accuracy in the position of the small holes to be formed in the blank board. Available as the lubricant sheet is, for example, a sheet having a thickness of 0.1 to 3 mm and prepared from a mixture of 20 to 90 wt. % of a polyethylene glycol having an average molecular weight of at least 10000 and 80 to 10 wt. % of a water-soluble lubricant as disclosed in JP-A No. 4-92494. However, the lubricant sheet exhibits poor adhesion to the aluminum base board, becomes locally separated from the base board and becomes uneven in its thickness, or irregularities occur in the surface of the entry board facing the blank board during drilling to cause a break in the drill or to impair the accuracy in the position of the small hole. Furthermore, the lubricant sheet is likely to crack or become uneven in thickness, or irregularities will occur in the surface of the entry board facing the blank board during drilling, consequently causing a break in the drill or impairing the accuracy in the position of the small hole.

An object of the present invention is to overcome the foregoing problems and to provide an entry board for use in drilling small holes wherein a lubricant layer is excellent in adhesion to a base board thereof and can be prevented from cracking.

DISCLOSURE OF THE INVENTION

The present invention provides a first entry board for use in drilling small holes comprising a lubricant layer of a mixture of a polyethylene glycol having an average molecular weight of at least 3000 to less than 10,000, a polyethylene glycol having an average molecular weight of at least 10000 and trimethylolpropane and formed over at least one surface of an aluminum base board, with an undercoat layer of a partially saponified product of polyvinyl acetate provided between the layer and the base board.

The term "aluminum" as used herein includes aluminum alloys in addition to pure aluminum. Further the term "board" includes foil.

In the first entry board for use in drilling small holes, the partially saponified product of polyvinyl acetate is 15 to 70 mole % in the degree of saponification and 9000 to 50000 in average molecular weight.

The partially saponified product of polyvinyl acetate has the properties of giving the lubricant layer improved adhesion to the aluminum base board, but if less than 9000 in average molecular weight, the product is ineffective in giving the lubricant layer improved adhesion to the base board. If exceeding 50000 in the average value, the product has a high viscosity to impair the lubricating properties and become less compatible with polyethylene glycol although giving the lubricant layer improved adhesion to the base board. Further if less than 15 mole % in the degree of saponification, the partially saponified product of polyvinyl acetate used becomes less soluble in water, with the result that the drilled board can not be cleaned easily by washing with water, whereas if in excess of 70 mole % in the degree, the product lowers the lubricating properties and becomes less compatible with polyethylene glycol. Accordingly, it is desirable to determine the degree of saponification of the partially saponified product of polyvinyl acetate from the range of 15 to 70 mole %.

The present invention provides a second entry board for use in drilling small holes comprising a lubricant layer of a mixture of a polyethylene glycol having an average molecular weight of at least 3000 to less than 10000, a polyethylene glycol. having an average molecular weight of at least 10000 and trimethylolpropane and formed over at least one surface of an aluminum base board, with an undercoat layer of a vinyl acetate-vinyl chloride copolymer provided between the layer and the base board.

With the second entry board for use in drilling small holes, the vinyl acetate-vinyl chloride copolymer contains 5 to 30 wt. % of vinyl acetate and 70 to 95 wt. % of vinyl chloride in a combined amount of 100 wt. % and has an average molecular weight of 15000 to 50000.

The vinyl acetate-vinyl chloride copolymer has the properties of giving the lubricant layer improved adhesion to the aluminum base board, but if less than 15000 in average molecular weight, the copolymer is ineffective in giving the lubricant layer improved adhesion to the base board. If exceeding 50000 in the average value, the copolymer has a high viscosity to become less amenable to coating although giving the lubricant layer improved adhesion to the base board. Further if the vinyl acetate-vinyl chloride copolymer used contains less than 5 wt. % of vinyl acetate and more than 95 wt. % of vinyl chloride, the lubricant layer exhibits impaired adhesion to the base board. When containing more than 30 wt. % of vinyl acetate and less than 70 wt. % of vinyl chloride, the copolymer gives off a stronger peculiar odor. Accordingly, it is desirable to determine the vinyl acetate content of the vinyl acetate-vinyl chloride copolymer from the range of 5 to 30 wt. %, and the vinyl chloride content thereof from the range of 70 to 95 wt. %.

The present invention provides a third entry board for use in drilling small holes comprising a lubricant layer of a mixture of a polyethylene glycol having an average molecular weight of at least 3000 to less than 10000, a polyethylene glycol having an average molecular weight of at least 10000 and trimethylolpropane and formed over at least one surface of an aluminum base board, with an undercoat layer of a vinyl acetate-vinyl chloride-maleic acid copolymer provided between the layer and the base board.

With the third entry board for use in drilling small holes, the vinyl acetate-vinyl chloride-maleic acid copolymer contains 4 to 30 wt. % of vinyl acetate, 70 to 95 wt. % of vinyl chloride and 0.1 to 3 wt. % of maleic acid in a combined amount of 100 wt. % and has an average molecular weight of 15000 to 50000.

The vinyl acetate-vinyl chloride-maleic acid copolymer has the properties of giving the lubricant layer improved adhesion to the aluminum base board, but if less than 15000 in average molecular weight, the copolymer. is ineffective in giving the lubricant layer improved adhesion to the base board. If exceeding 50000 in the average value, the copolymer has a high viscosity to become less amenable to coating although giving the lubricant layer improved adhesion to the base board. Further if the vinyl acetate-vinyl chloride-maleic. acid copolymer used contains less than 4 wt. % of vinyl acetate, the lubricant layer exhibits lower adhesion to the base board, whereas if the vinyl acetate content is in excess of 30 wt. %, the copolymer gives off a stronger peculiar odor. Further when the amount of vinyl chloride is less than 70 wt. %, a stronger peculiar odor will be given off. When the amount is in excess of 95 wt. %, the lubricant layer exhibits impaired adhesion to the base board. Further if the amount of maleic acid is less than 0.1 wt. %, the lubricant layer exhibits lower adhesion to the base board, but if the amount is over 3 wt. %, an increased cost will result. Accordingly, it is desirable that the vinyl acetate content of the vinyl acetate-vinyl chloride-maleic acid copolymer to be determined be within the range of 4 to 30 wt. %, the vinyl chloride content thereof within the range of 70 to 95 wt. %, and the maleic acid content thereof within the range of 0.1 to 3 wt. %.

When the first to third entry boards of the invention are used for drilling small holes, the undercoat layer functions to prevent the separation of the lubricant layer, further precluding the lubricant layer from cracking. The base board further acts to prevent formation of burrs when small holes are drilled. With burrs thus eliminated, an increased number of blank boards can be arranged in superposed layers for drilling at a time, hence improved productivity. With the formation of burrs prevented, moreover, it becomes possible to prevent damage to the metal layer of the printed wiring board to be produced from the blank board, precluding a break in the wiring of the circuit on the printed wiring board obtained. The first entry board for use in drilling small holes has a lubricant layer of a mixture of two kinds of polyethylene glycols which are different in average molecular weight and trimethylolpropane and is therefore excellent in lubricating properties as afforded by the lubricant layer. For example, in drilling small holes of up to 0.25 mm in diameter, the inner peripheral walls defining the holes can be prevented from becoming rough-surfaced.

With each of the first to third entry boards for use in drilling small holes, the undercoat layer has a thickness of 0.1 to 3.0 μm. If the undercoat layer is less than 0.1 μm in thickness, the lubricant layer-exhibits lower adhesion to the base board, whereas if the thickness exceeds 3.0 μm, an increased cost will result.

In each of the first to third entry boards of the invention for use in drilling small holes, the lubricant layer is prepared from a mixture comprising 10 to 70 parts by weight of a polyethylene glycol having an average molecular weight of at least 3000 to less than 10000, 30 to 90 parts by weight of a polyethylene glycol having an average molecular weight of at least 10000 and 0.5 to 20 parts by weight of trimethylolpropane per 100 parts by weight of combined amount of both the polyethylene glycols.

The polyethylene glycol having an average molecular weight of at least 3000 to less than 10000 has the properties of improving the water solubility and lubricating properties of the lubricant layer. However, if the content thereof is less than 10 parts by weight, these effects are not available, whereas if the content is over 70 parts by weight, the lubricant layer becomes sticky. Accordingly, it is preferable to determine the content of the polyethylene glycol having an average molecular weight of at least 3000 to less than 10000 from the range of 10 to 70 parts by weight. The polyethylene glycol at least 3000 to less than 10000 in average molecular weight is used because if the average molecular weight is less than 3000, it becomes difficult to form the lubricant layer and further because when the weight is not lower than 10000, lower lubricating properties will result.

The polyethylene glycol having an average molecular weight of at least 10000 has the properties of improving the strength of the lubricant layer. However, if the content thereof is less than 30 parts by weight, this effect is not available, whereas if the content is over 90 parts by weight, the lubricant layer becomes hard and brittle. Accordingly, it is preferable to determine the content of the polyethylene glycol having an average molecular weight of at least 10000 from the range of 30 to 90 parts by weight. The polyethylene glycol at least 10000 in average molecular weight is used because if the average molecular weight is less than 10000, the lubricant layer becomes very sticky as a film and difficult to form although satisfactory in solubility in water. Incidentally, the upper limit of the average molecular weight of the high molecular weight polyethylene glycol is about 100000.

In each of the first to third entry board of the invention for use in drilling small holes, the lubricant layer is 10 to 100 μm in thickness. If the thickness of the lubricant layer is less than 10 μm, satisfactory lubricating properties are not available, whereas if the thickness is over 100 μm, the mixture is not applicable effectively by coating to result in lower productivity and a higher material cost.

BEST MODE OF CARRYING OUT THE INVENTION

Figure 1:
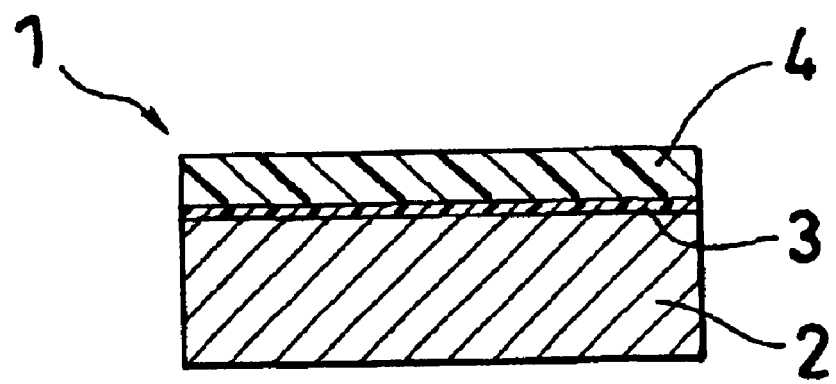
FIG. 1 is an enlarged view in vertical section and showing an entry board of the invention for use in drilling small holes.

Embodiments of the invention will be described below with reference to the drawing.

FIG. 1 shows an embodiment of entry board of the invention for use in drilling small holes.

With reference to FIG. 1, the entry board 1 comprises an aluminum base board 2, and a lubricant layer 4 formed over one surface of the aluminum base board 2 with an undercoat layer 3 provided therebetween.

The aluminum base board 2 is in the form of a single board of aluminum such as AA1100-H18, AA1050-H18, AA3003-H18, AA3004-H18 or like material. Alternatively, the base board 2 is prepared from an H18 material of an alloy (e.g., JIS AlN30) containing at least 99.30 wt. % of Al, up to 0.7 wt. % of Si and Fe in combined amount, up to 0.10 wt. % of Cu,. up to 0.05 wt. % of Mn, up to 0.05 wt. % of Mg and up to 0.05 wt. % of Zn. Preferably, the base board 2 is about 0.1 to about 0.25 mm in thickness. The base board 2 may be a board comprising a soft aluminum sheet 20 to 50 in Vickers hardness and 5 to 100 µm in thickness, and a hard aluminum sheet 50 to 140 in Vickers hardness and 30 to 200 µm in thickness and affixed to the soft aluminum sheet. In this case, the lubricant layer 4 is formed over the surface of the hard aluminum sheet with the undercoat layer 3 provided therebetween.

The undercoat layer 3 is 0.1 to 3.0 µm in thickness.

The undercoat layer 3 may comprise a partially saponified product of polyvinyl acetate 15 to 70 mole % in the degree of saponification and 9000 to 50000 in average molecular weight.

Alternatively, the undercoat layer 3 may comprise a vinyl acetate-vinyl chloride copolymer containing 5 to 30 wt. % of vinyl acetate and 70 to 95 wt. % of vinyl chloride in a combined amount of 100 wt. % and having an average molecular weight of 15000 to 50000.

Further alternatively, the undercoat layer 3 may comprise a vinyl acetate-vinyl chloride-maleic acid copolymer containing 4 to 30 wt. % of vinyl acetate, 70 to 95 wt. % of vinyl chloride and 0.1 to 3 wt. % of maleic acid in a combined amount of 100 wt. % and having an average molecular weight of 15000 to 50000.

The lubricant layer 4 is made by roll coating from a mixture comprising 10 to 70 parts by weight of a polyethylene glycol (PEG) having an average molecular weight of at least 3000 to less than 10000, 30 to 90 parts by weight of a PEG having an average molecular weight of at least 10000 and 0.5 to 20 parts by weight of trimethylolpropane per 100 parts by weight of combined amount of both the PEGs, and has a thickness of 10 to 100 µm.

In the case where a small hole is to be formed in blank boards for printed wiring boards using the entry board 1 shown in FIG. 1, the blank boards as superposed in layers are placed on a backup board first. The entry board 1 is then placed on the uppermost blank board, with the base board 2 of the entry board 1 down, that is, with the base board 2 facing the blank boards, and with the lubricant layer 4 thereof up. In this state, the drill bit of a drilling machine is used for forming a through hole in the entry board 1 from above and also a small hole (not shown) in all the blank boards. In this way, the small hole for use as a through hole or the like is formed in all the blank boards by a single operation.

In drilling the hole, the base board 2 functions to prevent formation of burrs. With the formation of burrs prevented, an increased number of blank boards can be arranged in superposed layers for one drilling operation to achieve higher productivity. Moreover, the prevention of formation of burrs obviates damage to the metal layer on the printed wiring board to be produced from the blank board, precluding the wiring of the circuit on the printed wiring board obtained from breaking.

Furthermore, in drilling small holes, for example, of up to 0.25 mm in diameter, the lubricant layer 4 functions to prevent the inner peripheral walls defining the holes from becoming rough-surfaced. Because the lubricant layer 4 is highly soluble in water, the blank board can be cleaned by washing with water after the small-hole drilling operation. Thus, the lubricant layer 4 can be removed from the blank board by a simple cleaning operation.

Examples of the present invention will be described next along with comparative examples.

EXAMPLE 1

An undercoat layer of a partially saponified product (brand name: SMR, product of Shin-Etsu Chemical Co., Ltd.) of polyvinyl acetate, 38000 in average molecular weight and 35 mole % in the degree of saponification, was formed to a thickness of 1.5 µm on one'surface of a base board made of AA3004-H18 material and having a thickness of 150 µm. A lubricant layer was then formed to a thickness of 30 µm on the undercoat layer from a mixture comprising 70 parts by weight of a PEG having an average molecular weight of 9000, 30 parts by weight of a PEG having an average molecular weight of 20000 and 15 parts by weight of trimethylolpropane per 100 parts by weight of combined amount of both the PEGs, whereby an entry board was prepared.

EXAMPLE 2

An entry board was prepared in the same manner as in Example 1 except that the lubricant layer was 80 µm in thickness.

EXAMPLE 3

An entry board was prepared in the same manner as in Example 1 except that an undercoat layer with a thickness of 1.5 µm was formed on one surface of the substrate using a vinyl acetate-vinyl chloride-maleic acid copolymer having an average molecular weight of 32000 and comprising 86 wt. % of vinyl chloride, 13 wt. % of vinyl acetate and 1 wt. % of maleic acid.

EXAMPLE 4

An entry board was prepared in the same manner as in Example 3 except that the lubricant layer was 80 µm in thickness.

EXAMPLE 5

An entry board was prepared in the same manner as in Example 1 except that an undercoat layer with a thickness of 1.5 µm was formed on one surface of the substrate using a vinyl acetate-vinyl chloride copolymer having an average molecular weight of 31000 and comprising 87 wt. % of vinyl chloride and 13 wt. % of vinyl acetate.

EXAMPLE 6

An entry board was prepared in the same manner as in Example 5 except that the lubricant layer was 80 µm in thickness.

COMPARATIVE EXAMPLE 1

An entry board was prepared by forming a lubricant layer with a thickness of 30 µm on one surface of a base board made of AA3004-H18 material and having a thickness of 150 μm using a mixture comprising 70 parts by weight of a PEG having an average molecular weight of 9000, 30 parts by weight of a PEG having an average molecular weight of 20000 and 15 parts by weight of trimethylolpropane per 100 parts by weight of combined amount of both the PEGs.

COMPARATIVE EXAMPLE 2

An entry board was prepared in the same manner as in Comparative Example 1 except that the lubricant layer was 80 μm in thickness.
Evaluation Test The entry boards of Examples 1 to 6 and Comparative Examples 1 and 2 were bent through 180 degrees with the lubricant layer bearing surface of each board positioned on the outer side and then checked for the state of the lubricant layer. The results are given in Table 1.

TABLE 1

|  | Test result |
| --- | --- |
| Example 1 | ◯ |
| 2 | ◯ |
| 3 | ◯ |
| 4 | ◯ |
| 5 | Δ |
| 6 | Δ |
| Comp. Ex. 1 | X |
| 2 | X |

In table 1,
◯ indicates no abnormality found in the lubricant layer,
Δ indicates slight separation of the lubricant layer, and
X indicates cracking or separation of the lubricant layer.

INDUSTRIAL APPLICABILITY

The entry board of the invention for use in drilling small holes is useful for forming small holes in boards, and more particularly for forming small holes serving as through holes in blank boards for wiring boards in producing printed wiring boards.

What is claimed is:

1. An entry board for use in drilling small holes comprising a lubricant layer of a mixture of a polyethylene glycol having an average molecular weight of at least 3000 to less than 10000, a polyethylene glycol having an average molecular weight of at least 10000 and trimethylolpropane and formed over at least one surface of an aluminum base board, with an undercoat layer of a partially saponified product of polyvinyl acetate provided between the layer and the base board.

2. An entry board for use in drilling small holes according to claim 1 wherein the partially saponified product of polyvinyl acetate is 15 to 70 mole % in the degree of saponification and 9000 to 50000 in average molecular weight.

3. An entry board for use in drilling small holes comprising a lubricant layer of a mixture of a polyethylene glycol having an average molecular weight of at least 3000 to less than 10000, a polyethylene glycol having an average molecular weight of at least 10000 and trimethylolpropane and formed over at least one surface of an aluminum base board, with an undercoat layer of a vinyl acetate-vinyl chloride copolymer provided between the layer and the base board.

4. An entry board for use in drilling small holes according to claim 3 wherein the vinyl acetate-vinyl chloride copoly mer contains 5 to 30 wt. % of vinyl acetate and 70 to 95 wt. % of vinyl chloride in a combined amount of 100 wt. % and has an average molecular weight of 15000 to 50000.

5. An entry board for use in drilling small holes comprising a lubricant layer of a mixture of a polyethylene glycol having an average molecular weight of at least 3000 to less than 10000, a polyethylene glycol having an average molecular weight of at least 10000 and trimethylolpropane and formed over at least one surface of an aluminum base board, with an undercoat layer of a vinyl acetate-vinyl chloride-maleic acid copolymer provided between the layer and the base board.

6. An entry board for use in drilling small holes according to claim 5 wherein the vinyl acetate-vinyl chloride-maleic acid copolymer contains 4 to 30 wt. % of vinyl acetate, 70 to 95 wt. % of vinyl chloride and 0.1 to 3 wt. % of maleic acid in a combined amount of 100 wt. % and has an average molecular weight of 15000 to 50000.

7. An entry board for use in drilling small holes according to claim 1 wherein the undercoat layer has a thickness of 0.1 to 3.0 μm.

8. An entry board for use in drilling small holes according to claim 1 wherein the lubricant layer is prepared from a mixture comprising 10 to 70 parts by weight of a polyethylene glycol having an average molecular weight of at least 3000 to less than 10000, 30 to 90 parts by weight of a polyethylene glycol having an average molecular weight of at least 10000 and 0.5 to 20 parts by weight of trimethylolpropane per 100 parts by weight of combined amount of both the polyethylene glycols.

9. An entry board for use in drilling small holes according to claim 8 wherein the lubricant layer has a thickness of 10 to 100 μm.

10. An entry board for use in drilling small holes according to claim 2 wherein the undercoat layer has a thickness of 0.1 to 3.0 μm.

11. An entry board for use in drilling small holes according to claim 3 wherein the undercoat layer has a thickness of 0.1 to 3.0 μm.

12. An entry board for use in drilling small holes according to claim 4 wherein the undercoat layer has a thickness of 0.1 to 3.0 μm.

13. An entry board for use in drilling small holes according to claim 5 wherein the undercoat layer has a thickness of 0.1 to 3.0 μm.

14. An entry board for use in drilling small holes according to claim 6 wherein the undercoat layer has a thickness of 0.1 to 3.0 μm.

15. An entry board for use in drilling small holes according to claim 2 wherein the lubricant layer is prepared from a mixture comprising 10 to 70 parts by weight of a polyethylene glycol having an average molecular weight of at least 3000 to less than 10000, 30 to 90 parts by weight of a polyethylene glycol having an average molecular weight of at least 100 and 0.5 to 20 parts by weight of trimethylolpropane per 100 parts by weight of combined amount of both the polyethylene glycols.

16. An entry board for use in drilling small holes according to claim 3 wherein the lubricant layer is prepared from a mixture comprising 10 to 70 parts by weight of a polyethylene glycol having an average molecular weight of at least 3000 to less than 10000, 30 to 90 parts by weight of a polyethylene glycol having an average molecular weight of at least 1000 and 0.5 to 20 parts by weight of trimethylolpropane per 100 parts by weight of combined amount of both the polyethylene glycols.

17. An entry board for use in drilling small holes according to claim 4 wherein the lubricant layer is prepared from a mixture comprising 10 to 70 parts by weight of a polyethylene glycol having an average molecular weight of at least 3000 to less than 10000, 30 to 90 parts by weight of a polyethylene glycol having an average molecular weight of at least 1000 and 0.5 to 20 parts by weight of trimethylolpropane per 100 parts by weight of combined amount of both the polyethylene glycols.

18. An entry board for use in drilling small holes according to claim 5 wherein the lubricant layer is prepared from a mixture comprising 10 to 70 parts by weight of a polyethylene glycol having an average molecular weight of at least 3000 to less than 10000, 30 to 90 parts by weight of a polyethylene glycol having an average molecular weight of at least 1000 and 0.5 to 20 parts by weight of trimethylolpropane per 100 parts by weight of combined amount of both the polyethylene glycols.

19. An entry board for use in drilling small holes according to claim 6 wherein the lubricant layer is prepared from a mixture comprising 10 to 70 parts by weight of a polyethylene glycol having an average molecular weight of at least 3000 to less than 10000, 30 to 90 parts by weight of a polyethylene glycol having an average molecular weight of at least 1000 and 0.5 to 20 parts by weight of trimethylolpropane per 100 parts by weight of combined amount of both the polyethylene glycols.

20. An entry board for use in drilling small holes according to claim 15 wherein the lubricant layer has a thickness of 10 to 100 $\mu$m.

21. An entry board for use in drilling small holes according to claim 16 wherein the lubricant layer has a thickness of 10 to 100 $\mu$m.

22. An entry board for use in drilling small holes according to claim 17 wherein the lubricant layer has a thickness of 10 to 100 $\mu$m.

23. An entry board for use in drilling small holes according to claim 18 wherein the lubricant layer has a thickness of 10 to 100 $\mu$m.

24. An entry board for use in drilling small holes according to claim 19 wherein the lubricant layer has a thickness of 10 to 100 $\mu$m.

* * * * *